United States Patent [19]

Itoh et al.

[11] Patent Number: 5,053,445
[45] Date of Patent: Oct. 1, 1991

[54] EPOXY RESIN COMPOSITION

[75] Inventors: Kunio Itoh; Toshio Shiobara; Koji Futatsumori; Kazutoshi Tomiyoshi; Hisashi Shimizu, all of Annaka, Japan

[73] Assignee: Shin-Etsu Chemical Co., Ltd., Tokyo, Japan

[21] Appl. No.: 397,739

[22] Filed: Aug. 23, 1989

Related U.S. Application Data

[60] Division of Ser. No. 179,538, Apr. 8, 1988, Pat. No. 4,877,822, which is a continuation-in-part of Ser. No. 916,934, Oct. 7, 1986, abandoned.

[30] Foreign Application Priority Data

Oct. 7, 1985 [JP] Japan .................................. 60-224210
Oct. 7, 1985 [JP] Japan .................................. 60-224211

[51] Int. Cl.$^5$ ........................ C08L 63/02; C08L 63/04
[52] U.S. Cl. .................................... 523/435; 523/436; 523/437; 525/476; 525/487
[58] Field of Search ................ 525/476, 487; 523/435, 523/436, 437

[56] References Cited

U.S. PATENT DOCUMENTS

| 2,819,245 | 1/1958 | Shorr | 525/476 |
| 4,125,510 | 11/1978 | Antonen | 523/435 |
| 4,376,174 | 3/1983 | Itoh et al. | 523/456 |
| 4,604,435 | 8/1986 | Koshii et al. | 525/476 |
| 4,614,766 | 9/1986 | Schimmel et al. | 525/104 |
| 4,657,986 | 4/1987 | Isayama | 525/407 |
| 4,701,482 | 10/1987 | Itoh et al. | 523/435 |
| 4,877,822 | 10/1989 | Itoh et al. | 523/433 |

FOREIGN PATENT DOCUMENTS

| 58-021417 | 2/1983 | Japan | 525/476 |
| 59-129252 | 7/1984 | Japan | 525/476 |
| 788806 | 1/1958 | United Kingdom | 525/476 |
| 906544 | 9/1962 | United Kingdom | 525/476 |

Primary Examiner—John C. Bleutge
Assistant Examiner—R. Dean, Jr.
Attorney, Agent, or Firm—Birch, Stewart, Kolasch & Birch

[57] ABSTRACT

An epoxy resin composition which comprises a curable epoxy resin, a curing agent, an inorganic filler, and at least one copolymer selected from copolymers obtained by an addition reaction between aromatic polymers containing one or more epoxy groups and one or more alkenyl groups and the specific organopolysiloxanes; copolymers obtained by an addition reaction between aromatic polymers containing one or more epoxy groups and the specific amino group-containing organopolysiloxanes.

8 Claims, No Drawings

EPOXY RESIN COMPOSITION

This application is a divisional of copending application Ser. No. 07/179,538 filed on Apr. 8, 1988, now U.S. Pat. No. 4,877,822 which was a continuation-in-part application of Ser. No. 06/916,934 filed on Oct. 7, 1986, now abandoned.

BACKGROUND OF THE INVENTION

1. Field of the Invention

The present invention relates to epoxy resin compositions which are suitable for use as molding materials, powder coating materials, encapsulators for semiconductors and the like.

2. Description of the Prior Art

Epoxy resin composition comprising epoxy resins and inorganic fillers have better characteristics, e.g. moldability, adhesiveness, electric characteristics, mechanical characteristics, moisture proofness and the like, than other thermosetting resins. Accordingly, epoxy resin compositions have wide utilities as various molding materials, powder coating materials and electric insulating materials, particularly as encapsulators for semiconductors.

However, most known epoxy resin compositions tend to crack upon curing, so that the appearance of the moldings and coatings is impeded and semiconductor elements or devices become defective.

In order to solve the above problems, the present inventors have proposed epoxy resin composition having a high resistance to cracking in which block copolymers of aromatic polymers and organopolysiloxanes are added to curable epoxy resins (Japanese Patent Application Laid-open No. 58-21417). However, there is a high demand for epoxy resin compositions which have a high resistance to cracking, a high glass transition point and a low coefficient of expansion, so that the degree of deformation upon molding is small with good moldability without sacrificing mechanical characteristics such as bending strength, a modulus of elasticity in flexure, mechanical strength and the like.

Japanese Patent Publication No. 49-49176, Japanese Patent Application Laid-open No. 59-129252, Japanese Patent Application Laid-open No. 60-69129 and Australian Patent No. 235757 disclose epoxy resin compositions containing an organopolysiloxane.

SUMMARY OF THE INVENTION

It is, accordingly, an object of the present invention to provide an epoxy resin composition which has, without sacrificing mechanical strength such as bending strength and modulus of elasticity in flexure, low coefficient of expansion, high glass transition point and high resistance to cracking with a reduced degree of deformation at the time of molding.

In order to achieve the above object, the present inventors made intensive studies on copolymer components which can bring about a good effect on the cracking resistance by incorporating into epoxy resin compositions, curable epoxy resins and curing agents as prominent components. As a result, it was found that copolymers obtained by the addition of organopolysiloxanes containing ≡SiH groups to aromatic polymers containing one or more epoxy groups and one or more alkenyl groups and copolymers obtained by the addition of organopolysiloxanes having amino groups to aromatic polymers containing one or more epoxy groups exhibit good characteristics as formulation agents for epoxy resin compositions. These copolymers contain little or no free organopolysiloxanes which are not bonded to epoxy resins. In addition, the copolymers have a varying solubility parameter after formation by the reaction depending on the type of polymer. In a case where organopolysiloxane having a relatively low molecular weight of from 1500 to 5000 are used, the solubility parameter is approximately in the range of from 7.3 to 8.5. Accordingly, the solubility in curable epoxy resins can be prevented by the use of such copolymers. When the copolymers are formulated in epoxy resin compositions, the resultant composition not only has a glass transition point which does not lower but increases approximately by 10° C., but also a low coefficient of expansion. In addition, the copolymers contain the same or similar epoxy resin segments as curable epoxy resins and have thus a high affinity for the curable epoxy resin. This permits microscopic dispersion with a drastically improved resistance to cracking. Such a composition ensures a small degree of deformation of aluminium electrodes in a case in which the composition is used as an encapsulator for a semiconductor. The present invention is accomplished based on the above findings.

According to the present invention, there is provided an epoxy resin composition which comprises a curable epoxy resin, a curing agent, an inorganic filler and a copolymer selected from the group consisting of [A] a copolymer obtained by an addition reaction between an aromatic polymer containing one or more epoxy groups and one or more alkenyl groups and an organopolysiloxane of the following formula (1)

in which R represents a substituted or unsubstituted monovalent hydrocarbon group, "a" is a value of from 0.01 to 0.1, "b" is a value of from 1.8 to 2.2 and $1.81 < a + b < 2.3$, and the number of silicon atoms in a molecule is an integer of from 20 to 400 and the number of hydrogen atoms directly connected to silicon atoms is an integer of from 1 to 5; [B] a copolymer obtained by an addition reaction between an aromatic polymer containing one or more epoxy groups and an amino group-containing organopolysiloxane of the following formula (2)

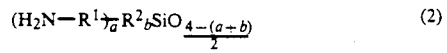

in which $R^1$ represents a divalent organic group, $R^2$ represents a monovalent organic group, "a" is a value of from 0.01 to 0.1, "b" is a value of from 1.8 to 2.2 and $1.81 < a + b < 2.3$, and the number of silicon atoms in a molecule is an integer of from 20 to 400.

The epoxy resin composition of the present invention comprises, aside from a curable epoxy resin, a curing agent and an inorganic filler, copolymer [A] obtained by an addition reaction between an aromatic polymer containing one or more epoxy groups and one or more alkenyl groups and an organopolysiloxane with a ≡SiH structure having a specific degree of polymerization and/or copolymer [B] obtained by an addition reaction between an aromatic polymer containing one or more epoxy groups and an amino group-containing organopolysiloxane having a specific degree of polymerization. By the incorporation of these copolymers the epoxy resin composition is characterized with a low coefficient of expansion, a high glass transition point, a high resistance of to cracking and a very small degree of deformation of aluminium electrodes without reduction of mechanical strengths such as a bending strength, and a modulus of elasticity in flexure. Such a composition is particularly suitable for use as molding materials, powder coating materials and encapsulators for semiconductors.

DETAILED DESCRIPTION OF THE INVENTION

Curable epoxy resins which are useful in the present invention are epoxy resins which have two or more epoxy groups in one molecule thereof. The epoxy resins are not critical with respect to their molecular structure, molecular weight and the like so far as they are cured by means of a variety of curing agents described later. In this sense, a number of currently known epoxy resins may be used for the purpose of the present invention. Examples of the epoxy resins include epoxy resins prepared, for example, from various type of novolac resins including bisphenol and epichlorohydrin, alicyclic epoxy resins, epoxy resins having halogen atoms such as chlorine, bromine or the like introduced thereinto, and the like. Among these, epoxydized novolac resins and epoxidized bisphenol A resins are preferred. The epoxy resin may preferably have an epoxy equivalent of 140 to 350, more preferably 160 to 220. The epoxy resins may be used singly or in combination.

These epoxy resins may be used in combination with monoepoxy resins. Examples of the monoepoxy resins include styrene oxide, cyclohexene oxide, propylene oxide, methyl glycidyl ether, allyl glycidyl ether, octylene oxide, dodecene oxide and the like.

The curing agents may be amine curing agents such as, for example, diaminodiphenylmethane, diaminodiphenylsulfone, methaphenylenediamine and the like, acid anhydride curing agents such as, for example, phthalic anhydride, pyromellitic anhydride, benzophenonetetracarboxylic anhydride and the like, and phenol novolac curing agents having two or more hydroxyl groups in the molecule thereof such as, for example, phenol novolac, cresol novolac and the like. Among these, phenol novolac and cresol novolac curing agents are preferred.

In the practice of the present invention, a variety of curing promotors may be used in order to promote the reaction between the curing agent and the epoxy resin. Examples of the promotors include imidazoles or their derivatives, tertiary amine derivatives, phosphine derivatives, cycloamidine derivatives and the like.

The curing agent is used in amounts ordinarily used for these purposes, although the amount of the curing agent may preferably be 20 to 100% based on the equivalent of the epoxy group of the epoxy resin, and the amount of a curing promotor may be within a range ordinarily used.

When an amount of the inorganic fillers used in the present invention is not larger than 100 parts by weight per 100 parts by weight of the total of the epoxy resin and curing agent, the resulting epoxy resin composition may, in some cases, have a low stress and may not show satisfactory results with respect to physical characteristics such as a cracking resistance. On the other hand, when the amount exceeds 1000 parts by weight, the fluidity becomes poor, so that the dispersion of inorganic filler may become difficult. Accordingly, the amount is preferred to be in the range of from 100 to 1000 parts by weight, more preferably from 250 to 750 parts by weight. The inorganic fillers are not critical with respect to the type and may be used singly or in combination. The fillers should be properly selected depending on the purpose of the epoxy resin composition. For instance, natural silica such as crystalline silica or non-crystalline silica, synthetic highly pure silica, synthetic spherical silica, talc, mica, silicon nitride, boron nitride, alumina and the like are used singly or in combination.

The copolymer formulated in the epoxy resin composition of the present invention is one or more copolymers selected from [A] reaction products obtained by an addition reaction between aromatic polymers containing one or more epoxy groups and one or more alkenyl groups and organopolysiloxane of the following formula (1)

(1)

in which R represents a substituted or unsubstituted monovalent hydrocarbon group, "a" is a value of from 0.01 to 0.1, preferably 0.01 to 0.05, "b" is a value of from 1.8 to 2.2, preferably 2.0 to 2.1 and $1.81 < a+b < 2.3$, preferably $2.01 < a+b < 2.05$, and the number of silicon atoms in a molecule is an integer of from 20 to 400, preferably 30 to 300 and the number of hydrogen atom directly connected to a silicon atom is an integer of from 1 to 5, preferably 2 to 3; and [B] reaction products obtained by aromatic polymers containing one or more epoxy groups and amino group-containing organopolysiloxanes of the following formula (2)

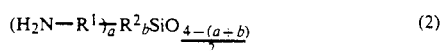
(2)

in which $R^1$ represents a divalent organic group, $R^2$ represents a monovalent organic group, "a" is a value of from 0.01 to 0.1, preferably 0.01 to 0.05, "b" is a value of from 1.8 to 2.2, preferably 2.0 to 2.1 and $1.81 < a+b < 2.3$, preferably $2.01 < a+b < 2.05$, and the number of silicon atoms in a molecule is an integer of from 20 to 400, preferably 30 to 300.

The aromatic polymers containing one or more epoxy groups and one or more alkenyl groups used to prepare copolymer [A] should preferably have 1 to 11, more preferably 2 to 7 epoxy groups and 1 to 5, more preferably 1 to 2 alkenyl groups such as vinyl groups and allyl groups in one molecule. The polymers may have an epoxy equivalent of 140 to 350, preferably 150 to 250. Preferred polymers are epoxidized phenol novolac resins having one or more alkenyl groups and epoxidized cresol novolac resins having one or more alkenyl groups.

The polymer may be obtained by epoxidizing an alkenyl group-containing phenolic resin with epichlorohydrin or by partial reaction of 2-allylphenol with a known epoxy resin.

Examples of the polymer are compounds of following formula (3), particularly formula (4). The compounds of formulae (5) to (7) are also preferred.

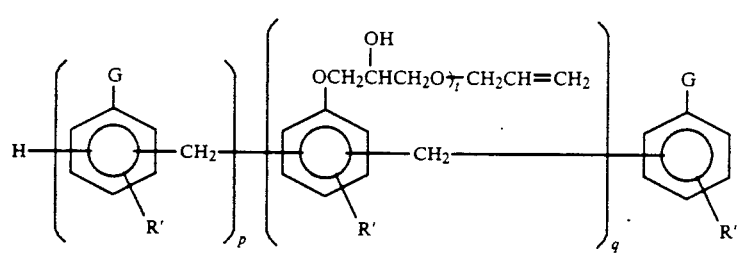

Formula (3)

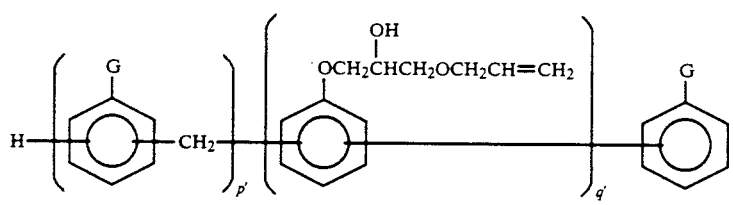

Formula (4)

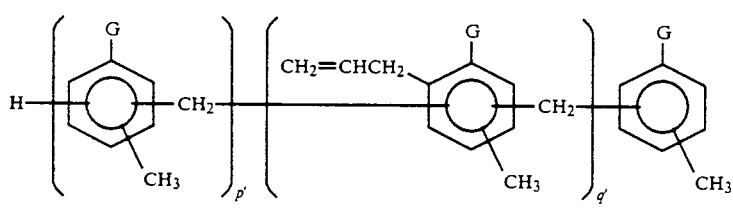

Formula (5)

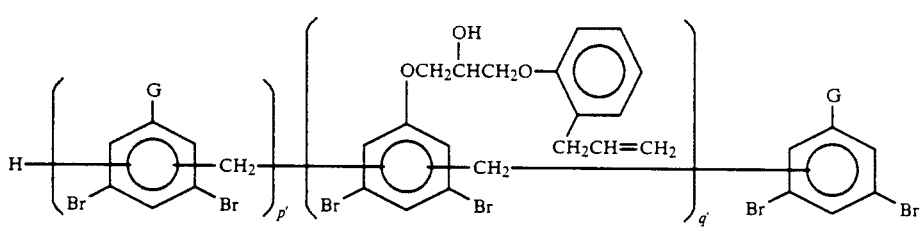

Formula (6)

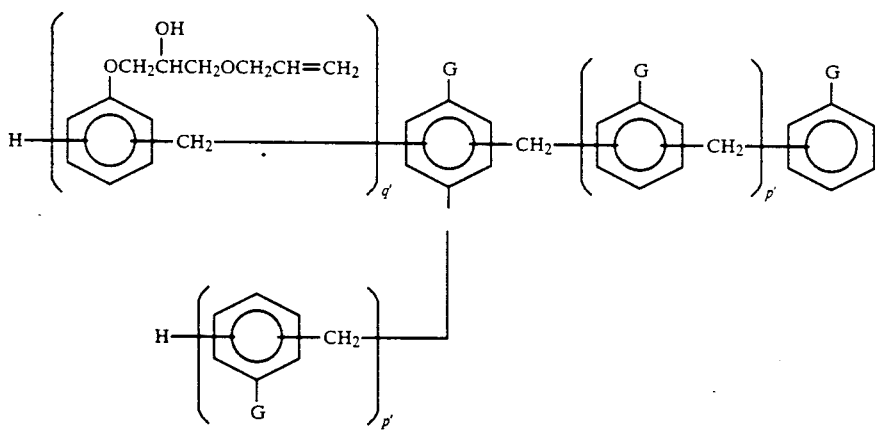

Formula (7)

In above formulae (3) to (7), R' represents hydrogen atom, a halogen atom such as chlorine atom and bromine atom, a monovalent hydrocarbon group having 1 to 8 carbon atoms such as an alkyl group, and a glycidyl ether group shown as

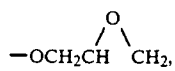

G represents a glycidyl ether group shown as

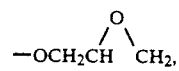

p is an integer of 0 to 20, p' is an integer of 0 to 10, q is an integer of 1 to 20, q' is an integer of 1 to 3, and t is 0 or 1.

The organopolysiloxanes represented by formula (1) may be any compound having at least one ≡SiH group in one molecule. In organopolysiloxane (1), the substituted or unsubstituted monovalent hydrocarbon group should preferably have 1 to 10 carbon atoms and includes an alkyl group having 1 to 10 carbon atoms such as a methyl group, an ethyl group and the like, an aryl group having 6 to 10 carbon atoms such as a phenyl group and the like, an alkoxy group having 1 to 5 carbon atoms such as a methoxy group, an ethoxy group and the like, and substituted alkyl and aryl groups in which one or more hydrogen atoms are substituted with a halogen atom, such as $ClC_3H_6—$,

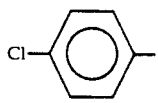

and the like. The introduction rate of the alkoxy group in the R of the formula (1), may be from 0 to 10 mole %. Among these, a methyl group and a phenyl group are preferred. Preferably, hydrogen-terminated dimethyl polysiloxane, hydrogen-terminated methylphenyl polysiloxane, hydrogen-terminated(2-trimethoxysilylethyl)-polysiloxane and the like are used. Specific examples include compounds of following formulae (8) to (12)

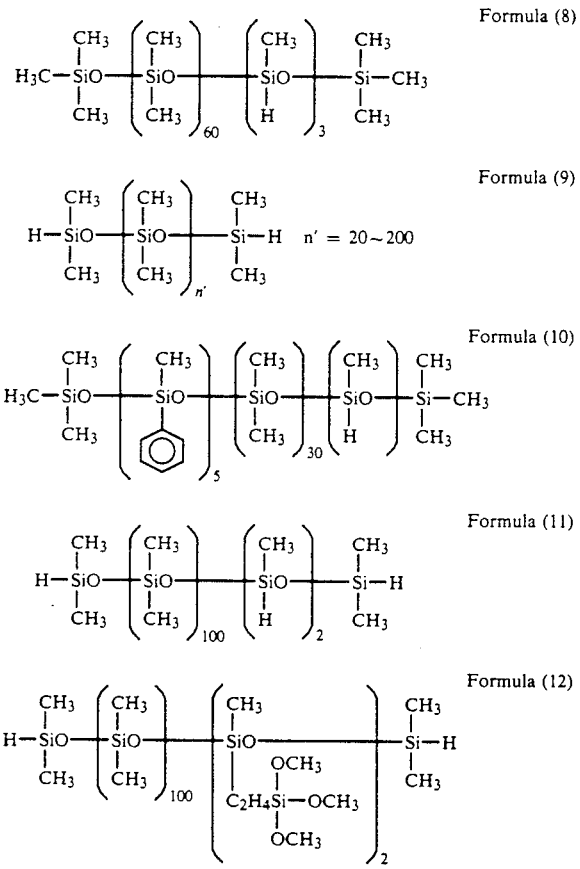

The organopolysiloxanes of the formula (1) has generally a degree polymerization "N" of from 20 to 400, preferably from 30 to 300, more preferably from 30 to 200. In the case where "N" is in less than 20, it is difficult to impart adequate flexibility and a high glass transition point (Tg), whereas when "N" is over 400, preparation of the copolymers is technically very difficult. In the event that copolymers are obtained, they cannot be readily dispersed, making it difficult to attain the purposes of the present invention.

In general, as "N" increases, organopolysiloxanes show better results with respect to the cracking resistance and glass transition point for the same silicon content, but tend to be lower in dispersability and adhesiveness to elements. In order to improve the dispersability and the adhesiveness to elements, it is effective and, in fact, preferable to introduce into side chains as shown in the formula (11) the following groups, e.g., —$C_2H_4Si(OCH_3)_3$,
—$CH_2$—$CH_2COOCH_3Si(OCH_3)_3$, and

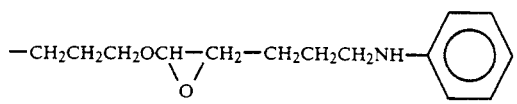

The introduction rate may be 0 to 10 mole % in the R of the formula (1).

Copolymers [A] can be obtained by thermal reaction between an aromatic polymer containing one or more epoxy groups and one or more alkenyl groups and an organopolysiloxane of formula (1) having an ≡SiH group in the presence of a known addition catalyst, e.g. a platinum catalyst such as chloroplatinic acid. Preferably, copolymer [A] should not be miscible with an epoxy resin in the epoxy resin composition and take a fine island structure in order that the resultant epoxy resin composition has a high glass transition point, a low coefficient of expansion and a high cracking resistance. In this sense, copolymer [A] is preferred to have a solubility parameter of from 7.3 to 8.5, more preferably from 7.6 to 8.2. In order to obtain a copolymer whose solubility parameter is within the above range, when the equivalence of ≡SiH in the organopolysiloxane is taken as X and the molecular weight of the aromatic polymer is taken as Y, the reaction is preferably carried out in the range of $0.7<X/Y<7.0$.

The aromatic polymer having one or more epoxy groups used to obtain copolymer [B] should preferably have 1 to 11, more preferably 2 to 7 of epoxy groups in one molecule. The polymers may have an epoxy equivalent of 140 to 350, preferably 150 to 250. Novolac epoxy resins which are obtained, for example, from various novolac resins including bisphenol and epichlorohydrin, and alicyclic resins are preferably used. In addition, the curable epoxy resins as indicated before may be also used for this purpose. The most preferred polymers are epoxidized phenol novolac resins and epoxidized cresol novolac resins.

The amino group-containing organopolysiloxanes represented by formula (2) may be organopolysiloxanes having at least one amino group in the molecule thereof. It is preferred that in formula (2), the divalent organic group of $R^1$ has 1 to 10 carbon atoms and includes methylene group, ethylene group, propylene group, butylene group and the like. The propylene group is most preferred. The monovalent organic group of $R^2$ preferably has 1 to 10 carbon atoms and includes an alkyl group having 1 to 10 carbon atoms such as methyl group and ethyl group, an alkoxy group having 1 to 5 carbon atoms, and an aryl group having 6 to 10 carbon atoms such as the phenyl group. The combination of methyl group and phenyl group or methyl group and —$CH_2CH_2Si(OCH_3)_3$ is most preferred. As the organopolysiloxane, γ-aminopropyldimethylsiloxy-blocked dimethylpolysiloxane is also preferably used. Specific examples include compounds of following formulae (13) to (16)

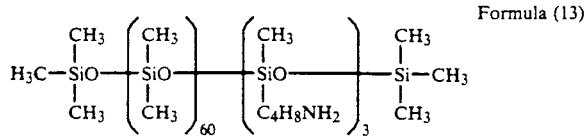
Formula (13)

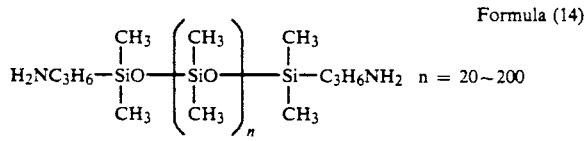
Formula (14)

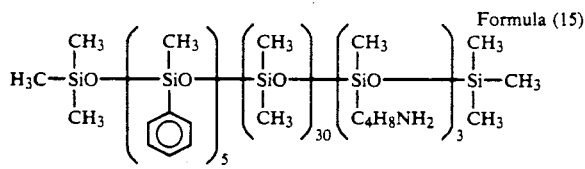
Formula (15)

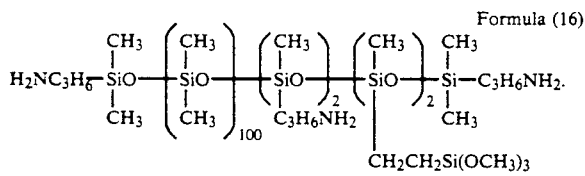
Formula (16)

The amino group-containing organopolysiloxanes of formula (2) have generally a degree of polymerization "N" of from 20 to 400, preferably from 30 to 300, more preferably from 30 to 200. If "N" is less than 20, the resultant composition is not imparted with satisfactory flexibility and a high glass transition point (Tg). On the contrary, when "N" exceeds 400, it is technically very difficult to obtain copolymers. Even if copolymers are obtained, they cannot readily be dispersed, thus making it impossible to attain the purposes of the present invention.

In general, organopolysiloxanes can give better results with respect to the cracking resistance and the tendency toward a high glass transition point as "N" increases for the same silicon level. However, the dispersability and the adhesiveness to elements tend to lower. In order to improve the dispersability and the adhesiveness to elements, it is preferred that not only a methyl group but also a propyl or a phenyl group be introduced as the organic group represented by R². Alternatively, part of R² should preferably be a group such as

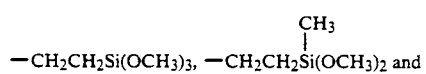

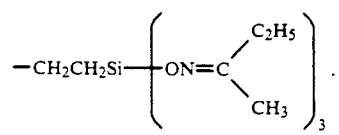

These amino group-containing organopolysiloxanes can be obtained by subjecting a starting material such as,

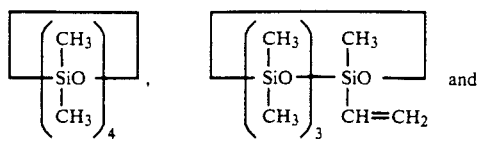

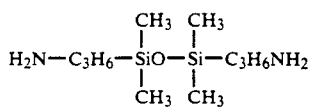

to a known equilibration reaction to give a polymer and further subjecting HSi(OCH₃)₃ to an addition reaction with the polymer.

Copolymer [B] is obtained by mixing an aromatic polymer containing one or more epoxy groups as indicated before and an amino group-containing organopolysiloxane at a normal temperature or a high temperature and subjecting the mixture to addition reaction. In order to mix both starting materials uniformly or substantially uniformly in the reaction, it is preferred to use a solvent such as methyl isobutyl ketone, toluene, dioxane, methyl cellosolve ®  or the like. Preferably, the reaction should be accelerated by using water, alcohols such as butanol, isopropyl alcohol, ethanol and the like, or phenols or by using, as a catalyst for the reaction, amines such as tributylamine, 1,8-diazabicycloundecene-1 and the like, organic phosphines such as triphenylphosphine, or imidazoles such as 2-phenylimidazole. Preferably, copolymer [B] should not be miscible with a curable epoxy resin contained in the epoxy resin composition and take a fine island structure in order that the epoxy resin composition has a high glass transition point, a low coefficient of expansion and a high resistance to cracking. To this end, the solubility parameter of the copolymer has generally from 7.3 to 8.5, preferably from 7.6 to 8.2. For the preparation of the copolymer having such a solubility parameter as defined above, when an equivalent of the amine in the organopolysiloxane is taken as X and the molecular weight of the aromatic polymer is taken as Y, the reaction should preferably be conducted within a range $0.7 < X/Y < 7.0$.

When the amount of the copolymers in the epoxy resin composition is less than 1 part by weight per 100 parts by weight of the total of an epoxy resin and a curing agent, the resultant epoxy resin composition is not satisfactorily improved in the glass transition point and the cracking resistance and may not have a good effect on the suppression of an aluminum wiring from movement in cases in which the composition is used as an encapsulator for a semiconductor device. Over 100 parts by weight, the mechanical strength of the resulting epoxy resin composition tends to become lowered. Accordingly, the amount may be in the range of from 1 to 100 parts by weight, preferably from 2 to 60 parts by weight.

If necessary, the composition of the present invention may further comprise various additives which depend on the purpose and the field of application. For instance, release agents such as waxes, fatty acids including stearic acid and metal salts thereof, pigments such as carbon black, dyes, antioxidants, flame retardants, surface treating agents such as γ-glycidoxypropyltrimethoxysilane, and other additives may be used.

The composition of the present invention is obtained by mixing predetermined amounts of the afore-indicated ingredients under agitation, kneading the mixture by means of a kneader, rolls or an extruder preheated to 70° to 95° C., cooling and pulverizing the mixture. The order of addition of the respective ingredients is not critical.

The epoxy resin composition of the present invention may be suitably used as molding materials and powder coating materials. In addition, the composition is effectively used for encapsulating semiconductor devices such as ICs, LSIs, transistors, thyristors, diodes and the like and for manufacture of printed circuits.

For encapsulating semiconductor devices, conventionally employed molding techniques such as, transfer molding, injection molding and casting techniques may be used. Preferably, the molding temperature for the epoxy resin composition is in the range of from 150° to 180° C. and the post curing is effected at a temperature of from 150° to 180° C. for 2 to 16 hours.

The preparatory examples of the copolymers used in the present invention are shown, in which Preparatory Examples 1 and 2 are for copolymers [A], Preparatory Examples 3 are for comparison, and Preparatory Examples 4 to 6 are for copolymers [B].

PREPARATORY EXAMPLE 1

A one liter four neck flask equipped with a reflux condenser, a thermometer, an agitator and a dropping funnel was provided, in which 300 g of an epoxidized phenol novolac resin (epoxy equivalent 195) was charged. Thereafter, while agitating at 110° C., a mixture of 32 g of 2-allylphenol and 1 g of tributylamine was dropped in 10 minutes, followed by continuing agitation at a temperature of 110° C. for further 2 hours. The resulting content was subjected to distillation under reduced pressure to remove unreacted 2-allylphenol and tributylamine therefrom, thereby obtaining an aromatic polymer containing epoxy groups and allyl groups [allyl group-containing epoxy resin (allyl equivalent 1490, epoxy equivalent 235)].

Subsequently, there were introduced into a four neck flask of the same type as used above 120 g of the aromatic polymer obtained above, 100 g of methylisobutyl ketone, 200 g of toluene, and 0.04 g of 2-ethylhexanol-modified chloroplatinic acid, followed by azeotropic dehydration for 1 hour. Thereafter, 80 g of organopolysiloxanes indicated in Table 1 were, respectively, dropped at a refluxing temperature in 30 minutes and agitated for reaction at the same temperature for 4 hours. The resulting product was washed with water and the solvent was distilled off under reduced pressure to obtain reaction products (copolymers I, II, and III).

TABLE 1

|  | Copolymer I | Copolymer II | Copolymer III |
| --- | --- | --- | --- |
| Starting organopolysiloxane | (note 1) compound (17) | (note 2) compound (18) | (note 3) compound (19) |
| Appearance | light yellow transparent solid | whitish yellow opaque solid | whitish yellow opaque solid |
| Melt viscosity (cps, 150° C.) | 650 | 760 | 890 |
| Loss in weight on heating (%, 150° C. 1 hr) | 0.42 | 0.56 | 0.45 |

(Note 1) Compound (17):

$$H-\left(\begin{array}{c}Me\\|\\SiO\\|\\Me\end{array}\right)_{30}-\begin{array}{c}Me\\|\\Si-H\\|\\Me\end{array}$$

(Note 2) Compound (18):

$$H-\left(\begin{array}{c}Me\\|\\SiO\\|\\Me\end{array}\right)_{100}-\begin{array}{c}Me\\|\\Si-H\\|\\Me\end{array}$$

(Note 3) Compound (19):

$$H-\left(\begin{array}{c}Me\\|\\SiO\\|\\Me\end{array}\right)_{100}\left(\begin{array}{c}Me\\|\\SiO\\|\\CH_2CH_2Si(OMe)_3\end{array}\right)_{2}-\begin{array}{c}Me\\|\\Si-H\\|\\Me\end{array}$$

PREPARATORY EXAMPLE 2

A four neck flask of the same type as used in Preparatory Example 1 was used, in which there were placed 200 g of an allyl glycidyl ether-modified phenol novolac resin having a softening point of 100° C. (phenol equivalent 125, allyl equivalent 1100), 800 g of chloromethyloxysilane and 0.6 g of cetyl trimethylammonium bromide. The mixture was heated and mixed under agitation at a temperature of 110° C. for 3 hours. The mixture was cooled down to a temperature of 70° C. and, after reduction to a pressure of 160 mmHg, 128 g of an aqueous 50% sodium hydroxide solution was dropped into the mixture in 3 hours under azeotropic dehydration. The content was reduced in pressure to remove the solvent by distillation and dissolved in a mixed solvent of 300 g of methyl isobutyl ketone and 300 g of acetone, followed by washing with water and distilling the solvent off under reduced pressure to obtain an aromatic polymer containing epoxy groups and allyl groups [allyl group-containing epoxy resin (allyl equivalent 1590, epoxy equivalent 190)]. Organopolysiloxanes indicated in Table 2 were used, followed by the procedure of Preparatory Example 1 to obtain reaction products indicated in Table 2 (copolymers IV, V).

TABLE 2

|  | Copolymer IV | Copolymer V |
| --- | --- | --- |
| Starting organopolysiloxane | compound (17) | compound (18) |
| Appearance | light yellow transparent solid | whitish yellow opaque solid |
| Melt viscosity (cps, 150° C.) | 530 | 660 |
| Loss in weight on heating (%, 150° C., 1 hr) | 0.34 | 0.40 |

PREPARATORY EXAMPLE 3

The general procedure of Preparatory Example 1 was repeated except that there were used, instead of the aromatic polymer resin, an allylphenol-containing phenol novolac resin (phenol equivalent 125, allyl equivalent 1100) and organopolysiloxanes indicated in Table 2, thereby obtaining reaction products (copolymers VI, VII) indicated in Table 3.

TABLE 3

|  | Copolymer VI | Copolymer VII |
| --- | --- | --- |
| Starting organopolysiloxane | compound (17) | compound (18) |
| Appearance | brown transparent solid | whitish yellow opaque solid |
| Melt viscosity (cps, 150° C.) | 1090 | 1330 |
| Loss in weight on heating (%, 150° C., 1 hr) | 0.62 | 0.83 |

PREPARATORY EXAMPLE 4

A one liter four neck flask equipped with a reflux condenser, a thermometer, an agitator and a dropping funnel was provided, in which 150 g of an epoxidized cresol novolac resin (epoxy equivalent 200) having a softening point of 70° C., 150 g of 1,4-dioxane and 150 g of n-butanol were placed. While agitating at a temperature of 83° C., 50 g of $\alpha,\omega$-bis(aminopropyl)dimethylpolysiloxane (compound of the afore-indicated formula (14)) having different degrees of polymerization, n, indicated in Table 4 was dropped in 2 hours, followed by agitation at the same temperature for further 6 hours for reaction. Thereafter, the content was subjected to distillation to remove the solvent, thereby obtain reaction products (copolymers VIII-X).

TABLE 4

|  | Copolymer VIII | Copolymer IX | Copolymer X |
| --- | --- | --- | --- |
| The number, n, of starting organopolysiloxane | 50 | 100 | 300 |
| Appearance | light yellow transparent solid | whitish yellow opaque solid | whitish yellow opaque solid |
| Melt viscosity (cps, 150° C.) | 990 | 1480 | 1920 |
| Loss in weight on heating (%, 150° C., 1 hr) | 0.48 | 0.53 | 0.57 |

PREPARATORY EXAMPLE 5

A four neck flask of the same type as used in Preparatory Example 4 was provided, in which there were placed 150 g of tris(4-hydroxyphenyl)methane triglycidyl ether (epoxy equivalent 150), 150 g of toluene, 150 g of isopropyl alcohol, 10 g of water and 20 g of amino group-containing organopolysiloxanes of the following formula (20) having degrees of polymerization, m and l, indicated in Table 5, followed by mixing under agitation and distilling off the solvent, thereby obtaining reaction products (copolymers XI to XIII) indicated in Table 5.

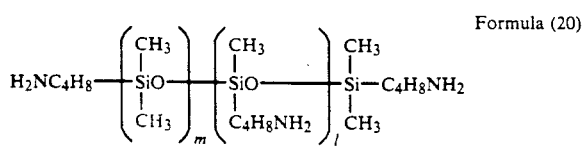

Formula (20)

TABLE 5

|  | Copolymer XI | Copolymer XII | Copolymer XIII |
| --- | --- | --- | --- |
| The numbers, m, and l of starting organopolysiloxane | 100 0 | 100 2 | 300 0 |
| Appearance | white opaque solid | white opaque solid | white opaque solid |
| Melt viscosity (cps, 150° C.) | 1060 | 1220 | 1360 |
| Loss in weight on heating (%, 150° C., 1 hr) | 0.37 | 0.45 | 0.67 |

PREPARATORY EXAMPLE 6

The general procedure of Preparatory Example 4 was repeated using, instead of $\alpha,\omega$-bis(aminopropyl)-dimethylpolysiloxane, 50 g of an amino group-containing organopolysiloxane of the following formula (21), thereby obtaining a reaction product (copolymer XIV) indicated in Table 6.

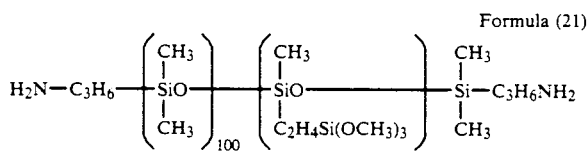

Formula (21)

TABLE 6

|  | Copolymer XIV |
| --- | --- |
| Appearance | white opaque solid |
| Melt viscosity (cps, 150° C.) | 1930 |
| Loss in weight on heating (%, 150° C., 1 hr) | 0.62 |

The present invention is more particularly described by way of examples and comparative examples but these examples should not be construed as limiting the present invention thereto. In examples and comparative examples, parts are by weight.

EXAMPLES 1-8 AND COMPARATIVE EXAMPLES 1-3

An epoxidized cresol novolac resin (curable epoxy resin I) having an epoxy equivalent of 200, a phenol novolac resin having a phenol equivalent of 110, the copolymers [A] obtained in Preparatory Examples, triphenylphosphine (TPP), and 1,8-diazabicycloundecene-7 (DBU) were used in amounts indicated in Table 7. There were added to the respective mixtures of 10 parts of a brominated epoxy novolac resin, 260 parts of fumed silica powder, 1.5 parts of 3-glycidoxypropylmethoxysilane, 1.5 parts of wax E and 1.0 part of carbon black. The resulting composition were each melted and mixed uniformly by means of two hot rolls to obtain eleven epoxy resin composition (Examples 1-8, Comparative Examples 1-3).

These epoxy resin compositions were subjected to the following tests (a) through (e).

(a) Spiral flow value:

A mold as prescribed in the EMMI standards was used and the test was effected under conditions of 175° C. and 70 kg/cm$^2$.

(b) Mechanical strength (bending strength and modulus of elasticity in flexure)

According to the method prescribed in JIS K 6911, a bar having a dimension of 10×4×100 mm, which was molded under conditions of 175° C. and 70 kg/cm² for molding time of 2 minutes and post-cured at 180° C. for 4 hours, was used for the measurement.

(c) Coefficient of expansion and glass transition temperature

A test piece having a size of 4 mmφ × 15 mm was used and subjected to measurement of the values by heating at a rate of 5° C. per minute by means of a dilatometer.

(d) Cracking resistance

A silicon chip having a dimension of 9.0×4.5×0.5 mm was adhered to a 14 pin-IC frame (42 alloy), over which an epoxy resin composition was molded under conditions of 180° C.×2 minutes and post-cured at 180° C. for 4 hours, followed by a repeated heat cycle of −196° C.×1 minute and 260° C.×30 seconds. After 50 cycles, the rate of occurrence of the resin crackings was measured (sample number is 50 for each compositions).

(e) Degree of deformation of an aluminium electrode

An aluminium electrode was vacuum deposited on a silicon chip having a dimension of 3.4×10.2×0.3 mm to obtain an element for measuring the degree of deformation. This element was bonded on a 14 pin-IC frame (42 alloy) over which an epoxy resin composition was molded under molding conditions of 180° C.×2 minutes and post-cured at 180° C. for 4 hours, followed by a repeated heat cycle of −196° C.×1 minute and 260° C.×30 seconds. After 20 cycles, the degree of deformation of the aluminum electrode was determined (sample number is 3 for each compositions).

The test results are shown in Table 7.

a powder coating material and an encapsulator for semiconductors.

EXAMPLES 9-12

The general procedure of Example 1 was repeated using, instead of epoxy resin I, a novolac resin of epoxidized bisphenol A (epoxy resin II) having an epoxy equivalent of 220 or a tris(4-glycidoxyphenyl)methane dimer (epoxy resin III) having an epoxy equivalent of 195 and formulations of a phenolic resin and copolymers indicated in Table 8, thereby obtaining epoxy resin compositions. The epoxy resin compositions were subjected to tests (a) through (e) in the same manner as in Example 1.

The test results are also shown in Table 8.

TABLE 8

|  | Example | | | |
|---|---|---|---|---|
|  | 9 | 10 | 11 | 12 |
| epoxy resin II (parts) | 45 | — | 44 | — |
| epoxy resin III (parts) | — | 42 | — | 41 |
| phenolic resin (parts) | 29 | 32 | 30 | 33 |
| copolymer II (parts) | 16 | 16 | — | — |
| copolymer V (parts) | — | — | 16 | 16 |
| spiral flow (inches) | 26 | 28 | 27 | 30 |
| bending strength (kg/mm²) | 14.2 | 14.8 | 14.6 | 15.3 |
| modulus of elasticity in flexure (kg/mm²) | 1200 | 1230 | 1140 | 1170 |
| coefficient of expansion ($\times 10^{-5}/°C.$) | 1.7 | 1.7 | 1.7 | 1.6 |
| glass transition temperature (°C.) | 175 | 176 | 182 | 185 |
| cracking resistance (%) | 0 | 0 | 0 | 0 |
| degree of deformation of Al electrode (μm) | 0 | 0 | 0 | 0 |

TABLE 7

|  | Example | | | | | | | | Comparative Example | | |
|---|---|---|---|---|---|---|---|---|---|---|---|
|  | 1 | 2 | 3 | 4 | 5 | 6 | 7 | 8 | 1 | 2 | 3 |
| epoxy resin I (parts) | 43 | 43 | 43 | 42 | 42 | 43 | 27 | 33 | 56 | 52 | 52 |
| phenolic resin (parts) | 31 | 31 | 31 | 32 | 32 | 31 | 31 | 35 | 34 | 22 | 22 |
| copolymer I (parts) | 16 | — | — | — | — | — | — | — | — | — | — |
| copolymer II (parts) | — | 16 | — | — | — | 16 | — | — | — | — | — |
| copolymer III (parts) | — | — | 16 | — | — | — | — | — | — | — | — |
| copolymer IV (parts) | — | — | — | 16 | — | — | — | — | — | — | — |
| copolymer V (parts) | — | — | — | — | 16 | — | 32 | 32 | — | — | — |
| copolymer VI (parts) | — | — | — | — | — | — | — | — | — | 16 | — |
| copolymer VII (parts) | — | — | — | — | — | — | — | — | — | — | 16 |
| TPP (parts) | 1.0 | 1.0 | 1.0 | 1.0 | 1.0 | — | 1.0 | — | 1.0 | 1.0 | 1.0 |
| DBU (parts) | — | — | — | — | — | 1.0 | — | 1.0 | — | — | — |
| spiral flow (inches) | 29 | 27 | 26 | 32 | 30 | 30 | 28 | 29 | 30 | 27 | 25 |
| bending strength (kg/cm²) | 14.1 | 13.8 | 13.6 | 14.5 | 14.0 | 13.7 | 13.5 | 13.2 | 13.5 | 12.6 | 12.9 |
| modulus of elasticity in flexure (kg/mm²) | 1150 | 1180 | 1200 | 1230 | 1200 | 1140 | 1100 | 1120 | 1400 | 1250 | 1300 |
| coefficient of expansion ($\times 10^{-5}/°C.$) | 1.7 | 1.7 | 1.7 | 1.7 | 1.7 | 1.7 | 1.7 | 1.7 | 1.8 | 1.9 | 1.9 |
| glass transition temperature (°C.) | 170 | 168 | 170 | 170 | 167 | 170 | 168 | 167 | 158 | 152 | 155 |
| cracking resistance (%) | 0 | 0 | 0 | 0 | 0 | 0 | 0 | 0 | 100 | 46 | 38 |
| degree of deformation of Al electrode (μm) | 0 | 0 | 0 | 0 | 0 | 0 | 0 | 0 | 0.4 | 0.8 | 0.6 |

As will be apparent from the results of Table 7, the epoxy resin compositions comprising copolymers [A] obtained by the reaction between epoxy resins and the specific types of organopolysiloxanes have not only a coefficient of expansion equal to or less than the copolymer [A]-free epoxy resin composition without impeding mechanical strengths such as the bending strength and the modulus of elasticity in flexure, but also higher glass transition temperatures, better cracking resistances and smaller degrees of deformation of the aluminium electrode. Thus the epoxy resin composition of the invention will be found to be suitable as a molding material, As will be apparent from the results of Table 8, the epoxy resin compositions formulated with the copolymers [A] of the present invention are not reduced in fluidity and mechanical strength and a low coefficient of expansion, a high glass transition temperature, a good cracking resistance and a small degree of deformation of the aluminium wiring.

EXAMPLES 13-21 AND COMPARATIVE EXAMPLES 4, 5

An epoxidized cresol novolac resin (curable epoxy resin IV) having an epoxy equivalent of 200, a phenol novolac resin having a phenol equivalent of 110, copolymers [B] prepared in Preparatory Examples, triphenyl phosphine (TPP) and 1,8-biazabicycloundecene-7 (DBU) were formulated as shown in Table 9, to which 10 parts of a brominated epoxy novolac resin, 10 parts of antimony trioxide, 1.5 parts of 3-glycidoxypropyl-trimethoxysilane, 1.5 parts of wax E and 1.0 part of carbon black were added. The mixtures were uniformly melted and mixed by means of two hot rolls to obtain 11 epoxy resin compositions (Examples 13-21 and Comparative Examples 4, 5).

The epoxy resin compositions were subjected to tests (a) through (e). The results are shown in Table 9 below.

TABLE 9

| | Example | | | | | | | | | Comparative Example | |
|---|---|---|---|---|---|---|---|---|---|---|---|
| | 13 | 14 | 15 | 16 | 17 | 18 | 19 | 20 | 21 | 4 | 5 |
| epoxy resin (parts) | 42 | 42 | 42 | 24 | 24 | 24 | 42 | 28 | 42 | 56 | 53 |
| phenolic resin (parts) | 32 | 32 | 32 | 32 | 32 | 32 | 32 | 30 | 32 | 34 | 31 |
| copolymer VIII (parts) | 16 | — | — | — | — | — | — | — | — | — | — |
| copolymer IX (parts) | — | 16 | — | — | — | — | 16 | 32 | — | — | — |
| copolymer X (parts) | — | — | 16 | — | — | — | — | — | — | — | — |
| copolymer XI (parts) | — | — | — | 34 | — | — | — | — | — | — | — |
| copolymer XII (parts) | — | — | — | — | 34 | — | — | — | — | — | — |
| copolymer XIII (parts) | — | — | — | — | — | 34 | — | — | — | — | — |
| copolymer XIV (parts) | — | — | — | — | — | — | — | — | 16 | — | — |
| TPP (parts) | 1.0 | 1.0 | 1.0 | 1.0 | 1.0 | 1.0 | — | 1.0 | 1.0 | 1.0 | 1.0 |
| Promotor (parts) | — | — | — | — | — | — | 1.0 | — | — | — | — |
| spiral flow (inches) | 30 | 29 | 28 | 33 | 31 | 31 | 30 | 28 | 28 | 30 | 24 |
| bending strength (kg/cm$^2$) | 14.3 | 14.5 | 14.0 | 14.8 | 13.6 | 14.5 | 13.7 | 13.5 | 14.3 | 13.5 | 9.8 |
| modulus of elasticity in flexure (kg/mm$^2$) | 1200 | 1230 | 1250 | 1240 | 1280 | 1240 | 1180 | 1100 | 1260 | 1400 | 1050 |
| coefficient of expansion ($\times 10^{-5}$/°C.) | 1.7 | 1.7 | 1.7 | 1.7 | 1.7 | 1.7 | 1.8 | 1.8 | 1.7 | 1.8 | 1.9 |
| glass transition temperature (°C.) | 168 | 170 | 173 | 169 | 170 | 174 | 170 | 173 | 172 | 158 | 165 |
| cracking resistance (%) | 0 | 0 | 0 | 0 | 0 | 0 | 0 | 0 | 0 | 100 | 46 |
| degree of deformation of Al electrode (μm) | 0 | 0 | 0 | 0 | 0 | 0 | 0 | 0 | 0 | 0.4 | 0.6 |
| mold releasability | 0 | 0 | 0 | 0 | 0 | 0 | 0 | 0 | 0 | 0 | x |

TABLE 10

| | Example | | | |
|---|---|---|---|---|
| | 22 | 23 | 24 | 25 |
| epoxy resin V (parts) | 44 | — | 26 | — |
| epoxy resin VI (parts) | — | 41 | — | 23 |
| phenolic resin (parts) | 30 | 33 | 30 | 33 |
| copolymer XIV (parts) | 16 | 16 | — | — |
| copolymer XI (parts) | — | — | 34 | 34 |
| spiral flow (inches) | 28 | 30 | 30 | 32 |
| bending strength (kg/mm$^2$) | 14.6 | 14.1 | 14.5 | 14.9 |
| modulus of elasticity in flexure (kg/mm$^2$) | 1240 | 1200 | 1250 | 1180 |
| coefficient of expansion ($\times 10^{-5}$/°C.) | 1.7 | 1.7 | 1.7 | 1.7 |
| glass transition temperature (°C.) | 179 | 187 | 182 | 188 |
| cracking resistance (%) | 0 | 0 | 0 | 0 |
| degree of deformation of Al electrode (μm) | 0 | 0 | 0 | 0 |
| mold releasability | 0 | 0 | 0 | 0 |

As will be apparent from the results of Table 9, the epoxy resin compositions formulated with copolymers [B] obtained by the reaction between epoxy resins and amino group-containing organopolysiloxanes having a specific degree of polymerization (N=20-400) have, without reduction of mechanical strengths such as the bending strengths and the modulus of elasticity in flexure, a coefficient of expansion equal to or less than the copolymer [B]-free epoxy resin compositions, and also have a higher glass transition temperature, a better cracking resistance and a smaller degree of deformation of the aluminum electrode.

EXAMPLES 22-25

The general procedure of Example 13 was repeated except that there was used, instead of epoxy resin IV, a novolac resin of epoxidized bisphenol A (epoxy resin V) having an epoxy equivalent of 220 or tris(4-glycidoxyphenyl)methane dimer (epoxy resin IV) having an epoxy equivalent of 195 and that the amounts of phenolic resin and copolymers were as indicated in Table 10, thereby obtaining epoxy resin compositions. These compositions were subjected to tests (a) through (e).

The test results are shown in Table 10.

The results of Table 10 reveal that the epoxy resin compositions formulated with the copolymers [B] according to the present invention do not lower in fluidity and mechanical strength and have a low coefficient of expansion, a high glass transition point, a good cracking resistance and a small degree of deformation of the aluminium wiring.

What is claimed is:

1. An epoxy resin composition comprising a curable epoxy resin, an epoxy resin curing agent, an inorganic filler and a copolymer obtained by an addition reaction between a novolac epoxy resin having 1 to 11 epoxy groups in one molecule and an amino group-containing organopolysiloxane of following formula (2)

$$(H_2N-R^1)_a R^2{}_b SiO_{\frac{4-(a+b)}{2}} \quad (2)$$

in which R$^1$ represents a methylene group, ethylene group, propylene group or butylene group, R$^2$ is independently selected from the group consisting of an alkyl group having 1 to 10 carbon atoms, an aryl group having 6 to 10 carbon atoms,

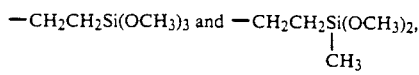

at least one member of R² being

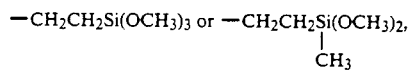

"a" is a value of from 0.01 to 0.1, "b" is a value of from 1.8 to 2.2 and 1.81<a+b<2.3, and the number of silicon atoms in one molecule is an integer of from 20 to 400.

2. The composition according to claim 1, wherein said curable epoxy resin is at least one resin selected from the group consisting of novolac epoxy resins and bisphenol A epoxy resins.

3. The composition according to claim 1, wherein the copolymer is present in the amount of from 1 to 100 parts by weight per 100 parts by weight of the total of said curable epoxy resin and said curing agent.

4. The composition according to claim 1, wherein said inorganic filler is present in the amount of from 100 to 1000 parts by weight per 100 parts by weight of the total of said curable epoxy resin and said curing agent.

5. The composition according to claim 1, which further comprises a monoepoxy resin of styrene oxide, cyclohexene oxide, propylene oxide, methyl glycidyl ether, allyl glycidyl ether, octylene oxide or dodecene oxide.

6. The composition according to claim 1, which further comprises an imidazole, tertiary amine, phosphine or cycloamidine curing promotor.

7. The composition according to claim 1, in which the inorganic filler is silica, talc, mica, silicon nitride, boron nitride, alumina or combinations thereof.

8. An epoxy resin composition consisting essentially of a curable epoxy resin, a phenol novolac epoxy resin or a cresol novolac resin curing agent, from 100 to 1000 parts by weight per 100 parts by weight of the total of said curable epoxy resin and said curing agent of an inorganic filler, and from 1 to 100 parts by weight per 100 parts by weight of the total of said curable epoxy resin and said curing agent of a copolymer obtained by an addition reaction between a novolac epoxy resin having 1 to 11 epoxy groups in one molecule and an amino group-containing organopolysiloxane of following formula (2)

$$(H_2N-R^1)_a R^2_b SiO_{\frac{4-(a+b)}{2}} \qquad (2)$$

in which R¹ represents methylene group, ethylene group, propylene group or butylene group, R² is independently selected from the group consisting of an alkyl group having 1 to 10 carbon atoms, an aryl group having 6 to 10 carbon atoms,

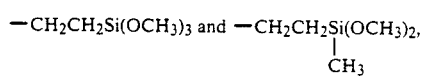

at least one member of R² being

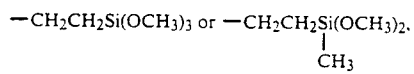

"a" is a value of from 0.01 to 0.1, "b" is a value of from 1.8 to 2.2 and 1.81<a+b<2.3, and the number of silicon atoms in one molecule is an integer of from 20 to 400.

* * * * *